United States Patent [19]

Bishop et al.

[11] Patent Number: 5,576,932
[45] Date of Patent: Nov. 19, 1996

[54] METHOD AND APPARATUS FOR COOLING A HEAT SOURCE

[75] Inventors: Eugene H. Bishop, Clemson; James A. Liburdy, Seneca; Richard S. Figliola, Central, all of S.C.; Gregory A. Failla, Hauppauge, N.Y.

[73] Assignee: AT&T Global Information Solutions Company, Dayton, Ohio

[21] Appl. No.: 524,022

[22] Filed: Aug. 31, 1995

[51] Int. Cl.$^6$ ............................................. H05K 7/20
[52] U.S. Cl. .................. 361/697; 165/80.3; 165/908; 257/721
[58] Field of Search .................. 165/80.2–80.4, 165/185, 908; 174/16.3; 257/706–707, 712–713, 714, 721, 722; 361/688–699, 704, 707, 709, 715, 717–718, 722

[56] References Cited

U.S. PATENT DOCUMENTS

| | | | |
|---|---|---|---|
| 4,399,484 | 8/1983 | Mayer | 361/382 |
| 4,686,606 | 8/1987 | Yamada et al. | 361/699 |
| 4,750,086 | 6/1988 | Mittal | 361/382 |
| 4,783,721 | 11/1988 | Yamamoto et al. | 361/382 |
| 4,882,654 | 11/1989 | Nelson et al. | 361/382 |
| 4,897,762 | 1/1990 | Daikoku et al. | 361/382 |
| 4,936,380 | 6/1990 | Niggemann | 165/908 |
| 5,005,640 | 4/1991 | Lapinski et al. | 165/170 |
| 5,023,695 | 6/1991 | Umezawa et al. | 361/699 |
| 5,025,856 | 6/1991 | VanDyke et al. | 165/908 |
| 5,028,989 | 7/1991 | Naganuma et al. | 357/82 |
| 5,054,545 | 10/1991 | Ghaemian | 361/696 |
| 5,103,374 | 4/1992 | Azar | 361/382 |
| 5,239,200 | 8/1993 | Messina et al. | 257/714 |
| 5,239,443 | 8/1993 | Fahey et al. | 361/689 |
| 5,264,984 | 11/1993 | Akamatsu | 361/689 |
| 5,265,670 | 11/1993 | Zingher | 165/80.4 |
| 5,270,572 | 12/1993 | Nakajima et al. | 257/714 |
| 5,294,830 | 3/1994 | Young et al. | 257/714 |
| 5,365,400 | 11/1994 | Ashiwake et al. | 165/80.3 |

FOREIGN PATENT DOCUMENTS 0474044  3/1992  European Pat. Off. ............. 361/694

*Primary Examiner*—Gregory D. Thompson
*Attorney, Agent, or Firm*—Paul J. Maginot

[57] ABSTRACT

A method of cooling a heat source, such as an integrated circuit device, includes the following steps (1) providing a base having a plurality of elongated fins on a first side thereof and a mating surface on a second side thereof, with the plurality of elongated fins defining a plurality of channels, (2) positioning the mating surface of the base in contact with the integrated circuit device, (3) advancing a first flow of fluid onto a top surface of each of the plurality of fins so as to form a quantity of spent fluid which continues to be advanced into the plurality of channels, and (4) advancing a second flow of fluid into the plurality of channels so as to exhaust the quantity of spent fluid from the plurality of channels. An apparatus for cooling a heat source is also disclosed.

12 Claims, 4 Drawing Sheets

METHOD AND APPARATUS FOR COOLING A HEAT SOURCE

BACKGROUND OF THE INVENTION

The present invention generally relates to a method and apparatus for cooling a heat source such as an integrated circuit device.

The temperature of an integrated circuit device must be maintained within a certain temperature range to ensure proper function, reliability and useful life. As a result, a variety of devices have been designed to cool integrated circuit devices.

For example, one technique for cooling integrated circuit devices is disclosed in U.S. Pat. No. 5,294,830 which describes a thermal conduction module comprising a chip-carrying surface and at least one integrated circuit chip on the substrate. A deformable, liquid-impermeable, thermally conductive film or foil extends over an upper surface of the chip. A piston has a lower surface which urges and conforms the film against the chip upper surface and contains at least one open channel permitting coolant passage and contact with the film without direct contact between the coolant and the chip.

Another example is U.S. Pat. No. 5,264,984 which describes a system for cooling electronic circuit components mounted on a substrate. The system includes containers placed on the respective components, and nozzles each having a central through-hole and peripheral through-holes. The outer bottom surface of each container is in thermal contact with a corresponding electronic circuit component. Liquid coolant is supplied into each container via the central through-hole, and discharged through the peripheral through holes to a location outside the container.

Another example is U.S. Pat. No. 5,239,443 which describes a blind hole cold plate cooling system having a fluid inlet manifold with at least one jet nozzle and a heat transfer plate with a first and second surface. The first surface has a complimentary cavity for receiving the jet nozzle. The second surface is planar for contact with at least one heat generating device. The cooling system also has an annular gap defined by the center periphery of the jet nozzle and the surface of the complementary cavity.

U.S. Pat. No. 5,239,200 discloses an apparatus including a thermally conductive cooling plate which has a plurality of integral closed end channels. A cover adapted to seal the periphery of the cooling member is provided and is spaced from the channel-containing surface. The cover has a plurality of integral baffles extending toward the cooling member into and along the length of the channels. The baffles and channels are spaced from each other to permit passage of a coolant in a flow direction normal to the channels. An inlet and outlet for coolant are provided on opposite ends of the apparatus.

U.S. Pat. No. 5,005,640 teaches a cooler having a plurality of first passages in fluid communication with a plurality of second passages. A coolant flows through the second passages and then through the first passages which are in close proximity to a heating source. The first and second passages are oriented and connected such that the direction of coolant flow in the first passages is opposite to the direction of flow in the second passages.

U.S. Pat. No. 4,897,762 discloses a cooling system in which a fluid is sprayed against the cooling surface of an electronic circuit device to cool the device and air is supplied in the opposite direction to the flow of the fluid to form an air curtain, thereby preventing the fluid from depositing on the electric circuitry of the devices.

U.S. Pat. No. 4,750,086 teaches an apparatus including a heat spreader having a planar surface urged against a planar surface of a chip by flexible microbellows. The surface area of the heat spreader is greater than the mating surface area of the chip. The heat spreader is attached to the bottom surface of the microbellows, The surface area of the heat spreader which mates with the surface of the chip is highly polished and coated with a highly conductive soft metal. A jet of coolant is forced into the inner surface of the microbellows.

Some of the aforementioned designs of cooling devices for integrated circuits are mechanically complex and would be relatively expensive to implement. Others designs would consume a relatively large amount of space which is a critical parameter in many electronic component environments.

It would be desirable to provide an apparatus and method for cooling a heat source such as an integrated circuit device which is relatively inexpensive to implement and would not consume a relatively large amount of space in an electronic component environment. It would also be desirable to provide an apparatus and method for cooling a heat source such as an integrated circuit device which provides enhanced cooling of the heat source.

SUMMARY OF THE INVENTION

In accordance with one embodiment of the present invention, there is provided an apparatus for cooling a heat source. The apparatus includes a thermally conductive base having a plurality of channels defined therein, said base being positioned in contact with said heat source. The apparatus also includes a mechanism for advancing a first flow of fluid against said base. The apparatus further includes a mechanism for advancing a second flow of fluid into the channels.

Pursuant to another embodiment of the present invention, there is provided a method of cooling a heat source. The method includes the following steps: (1) providing a thermally conductive base having a plurality of channels defined therein, (2) positioning the basin contact with the heat source, (3) directing a first flow of fluid onto the base, and (4) directing a second flow of fluid into the plurality of channels.

Pursuant to yet another embodiment of the present invention, there is provided a method of cooling an integrated circuit device. The method includes the following steps: (1) providing a thermally conductive base having a plurality of fins on a first side thereof and a mating surface on a second side thereof, with the plurality of fins defining a plurality of channels, (2) positioning the mating surface of the base in contact with the integrated circuit device, (3) advancing a first flow of fluid onto a top surface of the plurality of fins so as to form a quantity of spent fluid which continues to be advanced into the plurality of channels, and (4) advancing a second flow of fluid through the plurality of channels so as to exhaust the quantity of spent fluid from the plurality of channels.

It is therefore an object of the present invention to provide an improved apparatus and method for cooling a heat source.

It is another object of the present invention to provide a new and useful apparatus and method for cooling a heat source.

It is yet another object of the present invention to provide an apparatus and method for cooling a heat source such as an integrated circuit device which is relatively inexpensive to implement.

It is still another object of the present invention to provide an apparatus and method for cooling a heat source such as an integrated circuit device which would not consume a relatively large amount of space in an electronic component environment.

It is yet another object of the present invention to provide an apparatus and method for cooling a heat source such as an integrated circuit device which provides for enhanced cooling of the heat source.

The above and other objects, features, and advantages of the present invention will become apparent from the following description and attached drawings.

DETAILED DESCRIPTION OF THE PREFERRED EMBODIMENT

Figure 1:
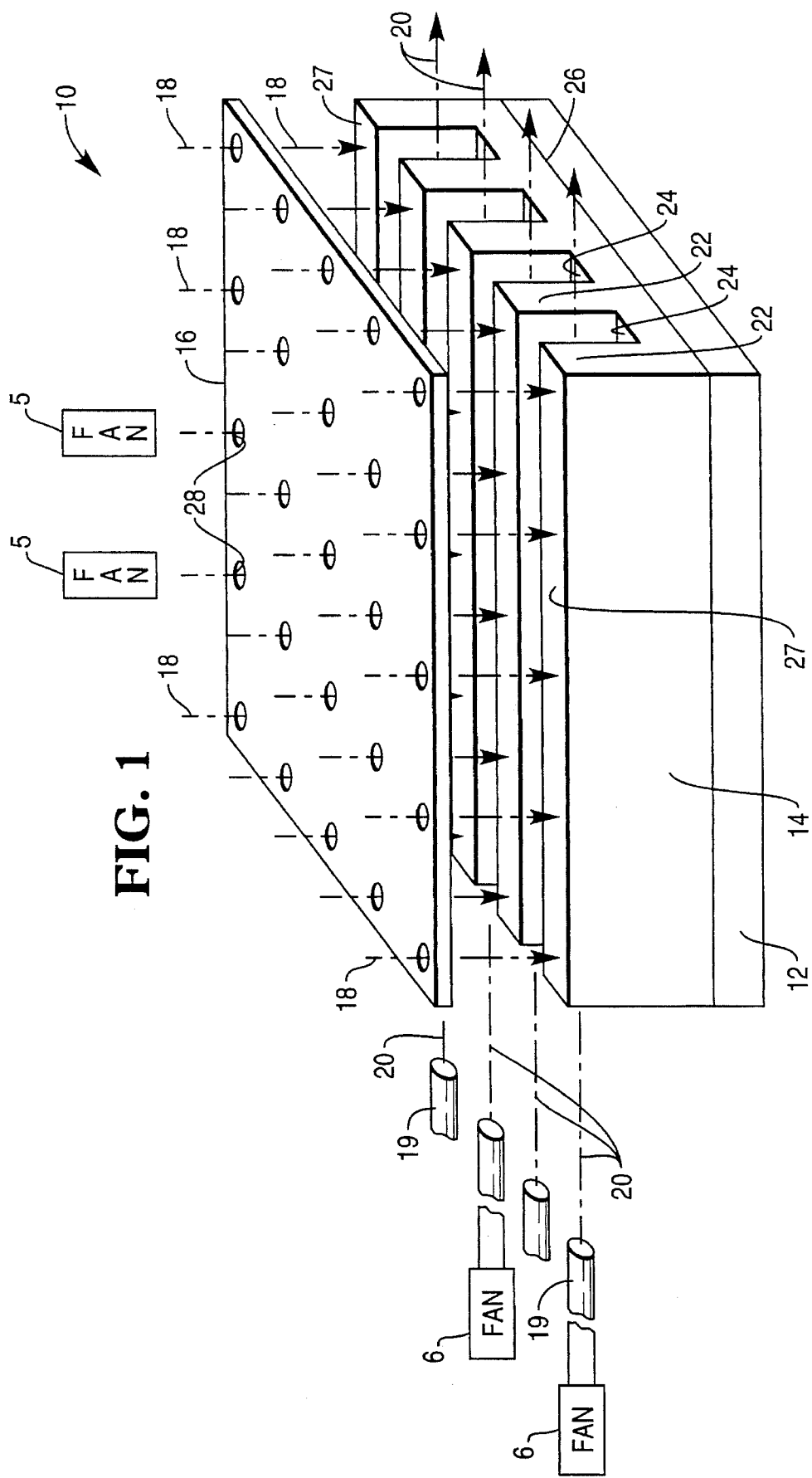
FIG. 1 is a perspective view of a cooling apparatus which incorporates the features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a cooling apparatus 10 which incorporates the features of the present invention therein. The cooling apparatus 10 is adapted to cool a heat source 12 such as an integrated circuit device.

Figure 2:
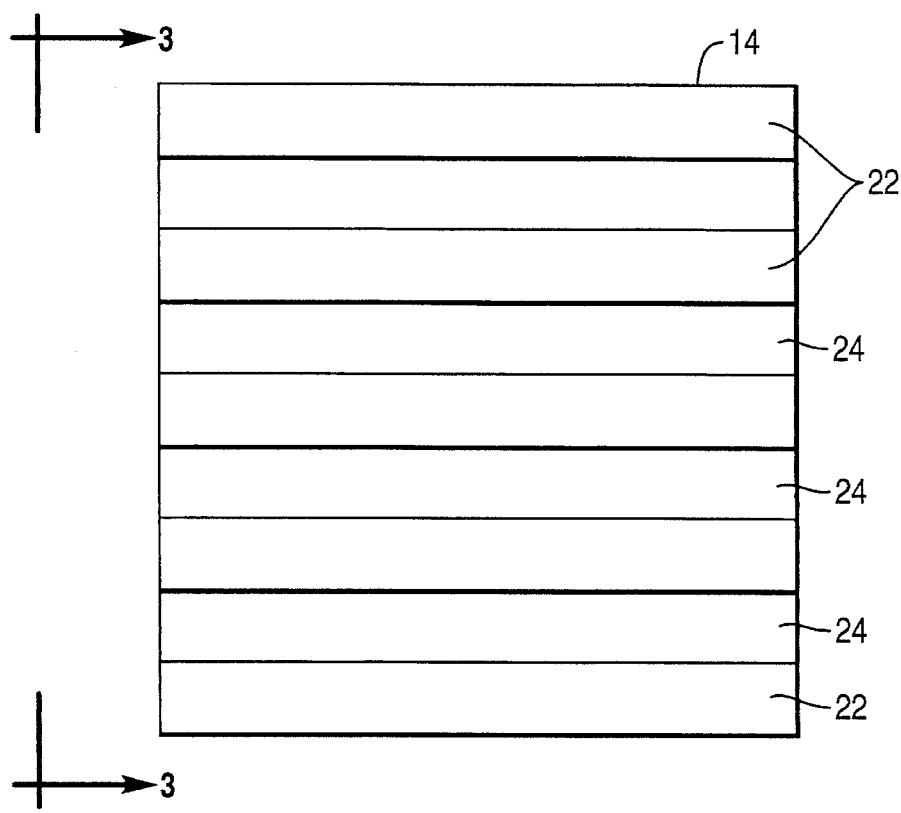
FIG. 2 is a top elevational view of a base of the cooling apparatus of FIG. 1.
Figure 3:
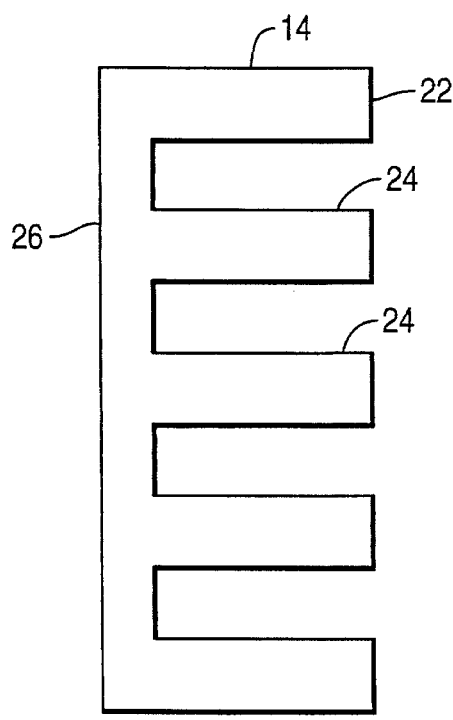
FIG. 3 is a side elevational view of the base taken along the line 3—3 of FIG. 2.
Figure 4:
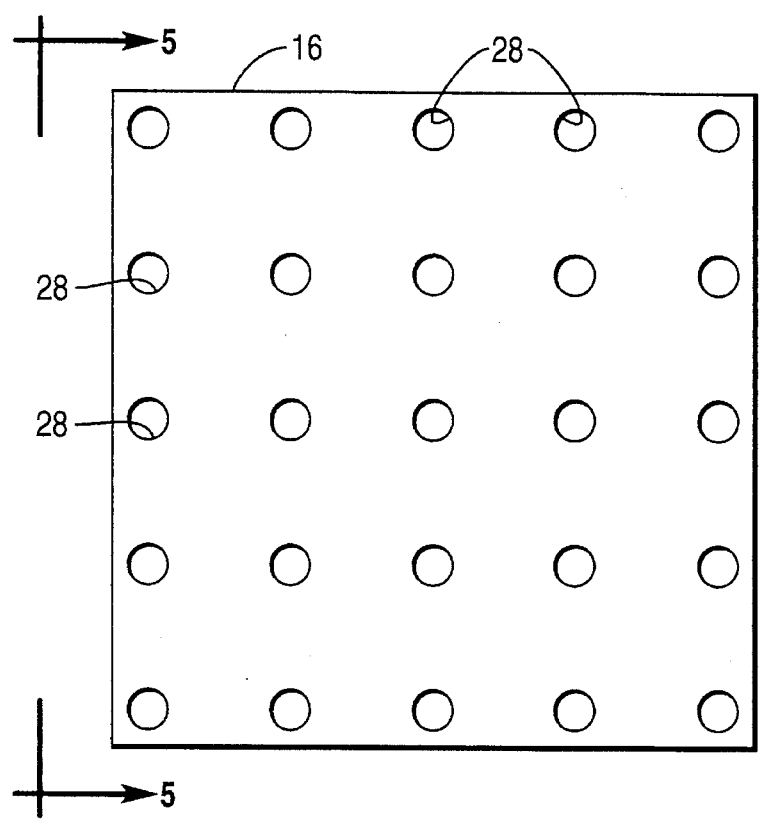
FIG. 4 is a top elevational view of a plate of the cooling apparatus of FIG. 1, with the plate having a plurality of openings defined therein.
Figure 5:
FIG. 5 is a side elevational view of the plate taken along the line 5—5 of FIG. 4.

The cooling apparatus 10 includes a base 14 and a plate 16. FIGS. 2 and 3 show the base 14 in more detail, while FIGS. 4 and 5 show the plate 16 in more detail. The cooling apparatus 10 further includes a first mechanism 5 that generates a first flow of fluid, indicated by arrow 18, such as air. The cooling apparatus 10 additionally includes a second mechanism 6 that generates a second flow of fluid, indicated by arrow 20, such as air, which is delivered by nozzles 19. The first mechanism and the second mechanism are each a fan. The first flow of fluid 18 and the second flow of fluid 20 are being generated simultaneously as shown in FIG. 1.

Figure 6:
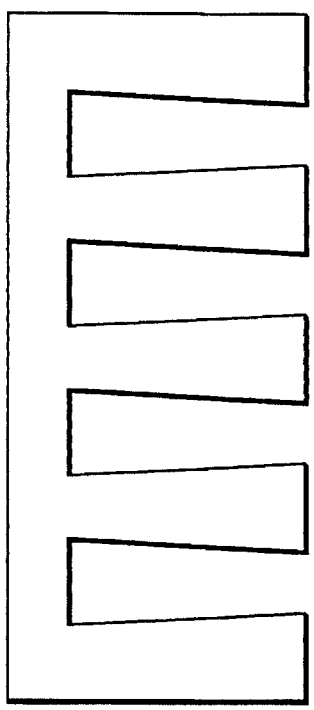
FIG. 6 shows a base having fins which are shaped in an increasingly tapered manner which is a first alternative to the base shown in FIG. 4.
Figure 7:
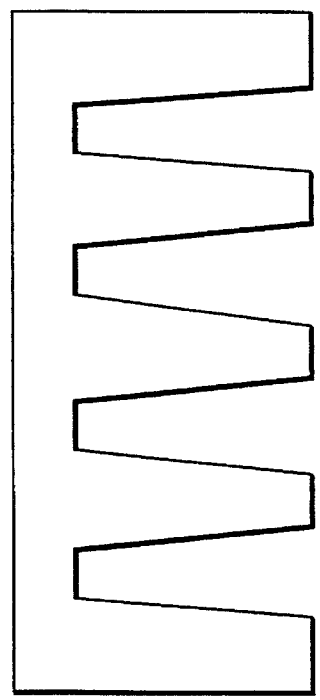
FIG. 7 shows a base having fins which are shaped in a decreasingly tapered manner which is a second alternative to the base shown in FIG. 4.

The base 14 is made of a metal such as aluminum. The base includes a plurality of rectangularly-shaped fins 22 which are oriented in parallel with one another as shown in FIGS. 1–3. Alternatively, the fins may be shaped in an increasingly tapered manner as shown in FIG. 6 or a decreasingly tapered manner as shown in FIG. 7. Defined between each pair of adjacent fins 22 is a channel 24. On the side of the base opposite the fins 22 is a mating surface 26. The mating surface 26 is adapted to be positioned in contact with the heat source 12 as shown in FIG. 1.

The plate 16 is made of a rigid plastics material and has a plurality of openings 28 defined therein. The openings 28 are circular and are adapted to allow a fluid, such as air, to be advanced therethrough.

During operation of the cooling apparatus 10, the mating surface 26 of the base 14 is positioned in contact with the heat source 12. Thereafter, the first flow of fluid 18 is advanced through the openings 28 of the plate 16 so as to impinge upon a top surface 27 of the fins 22 of the base 14. In addition, the second flow of fluid 20 is advanced out of the nozzles 19 and into and through the channels 24.

It should be noted that when the first flow of fluid 18 contacts the top surface 27 of the fins 22, spent or heated fluid is formed which continues to be advanced into the channels 24. The spent fluid then becomes entrained in the second flow of fluid 20 which is being advanced through the channels 24. Thereafter, the spent fluid along with the second flow of fluid is exhausted out of the channels 24, as shown in FIG. 1. With the spent fluid removed from the channels 24, it is prevented from recirculating in the physical space which is located adjacent to the base 14.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

What is claimed is:

1. A heat source cooling apparatus, comprising:
   a thermally conductive base having a plurality of channels defined therein, said base adapted to be positioned in contact with a heat source;
   means for advancing a first flow of fluid against said base; and
   means for advancing a second flow of fluid into the channels,
   wherein said base includes a plurality of fins which define the plurality of channels,
   wherein said first flow advancing means is adapted to advance the first flow of fluid against the plurality of fins so as to form a quantity of spent fluid,
   wherein the quantity of spent fluid is advanced into the plurality of channels, and
   wherein said second flow advancing means is adapted to force the quantity of spent fluid out of the plurality of channels.

2. The apparatus of claim 1, wherein said first flow advancing means is adapted to advance the first flow of fluid against a top surface of said plurality of fins.

3. The apparatus of claim 1, wherein said first flow advancing means includes a plate positioned over said base, said plate having a plurality of openings defined therein.

4. The apparatus of claim 3, wherein each of the plurality of openings defined in said plate are aligned with one of the plurality of fins.

5. The apparatus of claim 1, wherein said first flow advancing means advances the first flow of fluid during the same time period that said second flow advancing means advances the second flow of fluid.

6. A heat source cooling method, comprising the steps of:

providing a thermally conductive base having a plurality of channels defined therein;

positioning the base in contact with a heat source;

directing a first flow of fluid onto the base; and directing a second flow of fluid into the plurality of channels, wherein the base includes a plurality of fins which define the plurality of channels, wherein the first flow directing advancing step includes the step of advancing the first flow of fluid onto the plurality of fins so as to form a quantity of spent fluid, wherein the first flow directing step further includes the step of advancing the quantity of spent fluid into the plurality of channels, and wherein the second flow directing step includes the step of forcing the quantity of spent fluid out of the plurality of channels.

7. The method of claim 6, wherein the first flow directing step is performed concurrently with the second flow directing step.

8. The method of claim 6, wherein the first flow directing step further includes the step of advancing the first flow of fluid against a top surface of the plurality of fins.

9. A heat source cooling method, comprising the steps of:

providing a thermally conductive base having a plurality of channels defined therein;

positioning the base in contact with a heat source;

directing a first flow of fluid onto the base; and directing a second flow of fluid into the plurality of channels, wherein the base includes a plurality of fins which define the plurality of channels, wherein the first flow directing step includes the step of advancing the first flow of fluid onto the plurality of fins so as to form a quantity of spent fluid, wherein the first flow directing step further includes the steps of:

providing a plate having a plurality of openings defined therein;

positioning the plate over the base so that each of the plurality of openings is aligned with one of the plurality of fins; and advancing the first flow of fluid through the plurality of openings so that the first flow of fluid impinges onto the plurality of fins.

10. An integrated circuit device cooling method, comprising the steps of:

providing a thermally conductive base having a plurality of fins on a first side thereof and a mating surface on a second side thereof, with the plurality of fins defining a plurality of channels;

positioning the mating surface of the base in contact with an integrated circuit device;

advancing a first flow of fluid onto a top surface of the plurality of fins so as to form a quantity of spent fluid which continues to be advanced into the plurality of channels; and advancing a second flow of fluid through the plurality of channels so as to exhaust the quantity of spent fluid from the plurality of channels.

11. The method of claim 10, wherein the first flow advancing step includes the steps of:

providing a plate having a plurality of openings defined therein;

positioning the plate over the base so that each of the plurality of openings is aligned with one of the plurality of fins; and advancing the first flow of fluid through the plurality of openings so that the first flow of fluid impinges onto the plurality of fins.

12. The method of claim 10, wherein the first flow advancing step is performed concurrently with the second flow advancing step.

* * * * *